(12) United States Patent
Hong et al.

(10) Patent No.: US 7,870,362 B2
(45) Date of Patent: Jan. 11, 2011

(54) SEMICONDUCTOR MEMORY DEVICE HAVING ADVANCED TAG BLOCK

(75) Inventors: Sang-Hoon Hong, Ichon-shi (KR); Jin-Hong Ahn, Ichon-shi (KR); Jae-Bum Ko, Ichon-shi (KR); Se-Jun Kim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 373 days.

(21) Appl. No.: 10/879,660

(22) Filed: Jun. 28, 2004

(65) Prior Publication Data
US 2005/0144419 A1 Jun. 30, 2005

(30) Foreign Application Priority Data
Dec. 29, 2003 (KR) .................. 10-2003-0098502

(51) Int. Cl.
G06F 12/00 (2006.01)
G06F 12/02 (2006.01)
G06F 12/08 (2006.01)
G06F 12/10 (2006.01)

(52) U.S. Cl. ............... 711/203; 711/104; 711/105; 711/202

(58) Field of Classification Search ............ 711/104, 711/105, 202, 203
See application file for complete search history.

(56) References Cited

U.S. PATENT DOCUMENTS

| | | | | | |
|---|---|---|---|---|---|
| 4,132,904 | A | * | 1/1979 | Harari | 365/185.07 |
| 4,855,628 | A | * | 8/1989 | Jun | 327/57 |
| 4,932,000 | A | * | 6/1990 | Kodama et al. | 365/230.06 |
| 4,979,145 | A | * | 12/1990 | Remington et al. | 711/106 |
| 5,339,399 | A | * | 8/1994 | Lee et al. | 711/146 |
| 5,390,308 | A | * | 2/1995 | Ware et al. | 711/5 |
| 5,535,167 | A | * | 7/1996 | Hazani | 365/218 |
| 5,625,308 | A | * | 4/1997 | Matsumoto et al. | 327/203 |
| 5,751,656 | A | * | 5/1998 | Schaefer | 365/233.5 |
| 5,781,471 | A | * | 7/1998 | Kowshik et al. | 365/185.07 |
| 5,860,092 | A | * | 1/1999 | Breid et al. | 711/118 |

(Continued)

FOREIGN PATENT DOCUMENTS

JP 02-032439 2/1990

(Continued)

OTHER PUBLICATIONS

Handy, Jim. The Cache Memory Book. 1998. Academic Press, Inc. pp. 35-38.*

(Continued)

Primary Examiner—Sanjiv Shah
Assistant Examiner—Samuel Dillon
(74) Attorney, Agent, or Firm—Blakely, Sokoloff, Taylor & Zafman (57) ABSTRACT

A semiconductor memory device includes a row decoding block for decoding an inputted address to thereby generate a logical unit cell block address and a decoded word line address; a tag block for converting the logical unit cell block address into a physical unit cell block address; a decoded address latching block for latching the decoded word line address to thereby output the decoded word line address as a word line activation signal in response to the physical unit cell block; and a cell area for outputting a data, which is stored therein, in response to the word line activation signal.

9 Claims, 12 Drawing Sheets

U.S. PATENT DOCUMENTS

| | | | |
|---|---|---|---|
| 6,055,203 A * | 4/2000 | Agarwal et al. | 365/230.06 |
| 6,286,091 B1 * | 9/2001 | Park | 711/207 |
| 6,327,176 B1 * | 12/2001 | Li et al. | 365/156 |
| 6,339,817 B1 * | 1/2002 | Maesako et al. | 711/165 |
| 6,557,080 B1 * | 4/2003 | Burger et al. | 711/137 |
| 6,937,535 B2 * | 8/2005 | Ahn et al. | 365/222 |
| 7,068,561 B2 * | 6/2006 | Hong et al. | 365/230.03 |
| 7,123,497 B2 * | 10/2006 | Matsui et al. | 365/51 |
| 7,363,460 B2 * | 4/2008 | Ko et al. | 711/202 |
| 2008/0016270 A1 * | 1/2008 | Hirabayashi | 711/104 |

FOREIGN PATENT DOCUMENTS

| | | |
|---|---|---|
| JP | 06-243691 | 9/1994 |
| JP | 07-211062 | 8/1995 |
| JP | 08-212134 | 8/1996 |
| JP | 10-302473 | 11/1998 |
| JP | 2002-042475 | 2/2002 |
| KR | 10-2004-0040292 | 5/2004 |

OTHER PUBLICATIONS

Vinodh Cuppu, Bruce Jacob, Brian Davis, Trevor Mudge. High-Performance DRAMs in Workstation Environments. Nov. 2001. IEEE Transactions on Computers. pp. 1133-1153.*

Cuppu, V., Jacob, B., Davis, B., and Mudge, T. 1999. A performance comparison of contemporary DRAM architectures. May 1999. In Proceedings of the 26th Annual international Symposium on Computer Architecture. IEEE Computer Society, Washington, DC. pp. 222-233.*

* cited by examiner

SEMICONDUCTOR MEMORY DEVICE HAVING ADVANCED TAG BLOCK

FIELD OF INVENTION

The present invention relates to a semiconductor memory device; and, more particularly, to a tag block, for use in the semiconductor memory device, for reducing a data access time.

DESCRIPTION OF PRIOR ART

Generally, a semiconductor memory device is classified as a random access memory (RAM) and a read only memory (ROM).

The RAM includes a Dynamic RAM (DRAM) and a Static RAM (SRAM). One cell of the dynamic RAM has one transistor and one capacitor and that of the static RAM does four transistors and two load resistances. The DRAM is used more widespread than the SRAM because the DRAM is more efficient than SRAM in a chip integration and a manufacturing process.

Today, an operation speed of a central processing unit (CPU) is more dramatically advanced than that of the DRAM. As a result, many problems may arise because the operation speed of the memory device is slower than that of CPU. For overcoming these problems, several kinds of scheme in the memory device have been developed for a high speed data transmission.

Figure 1:
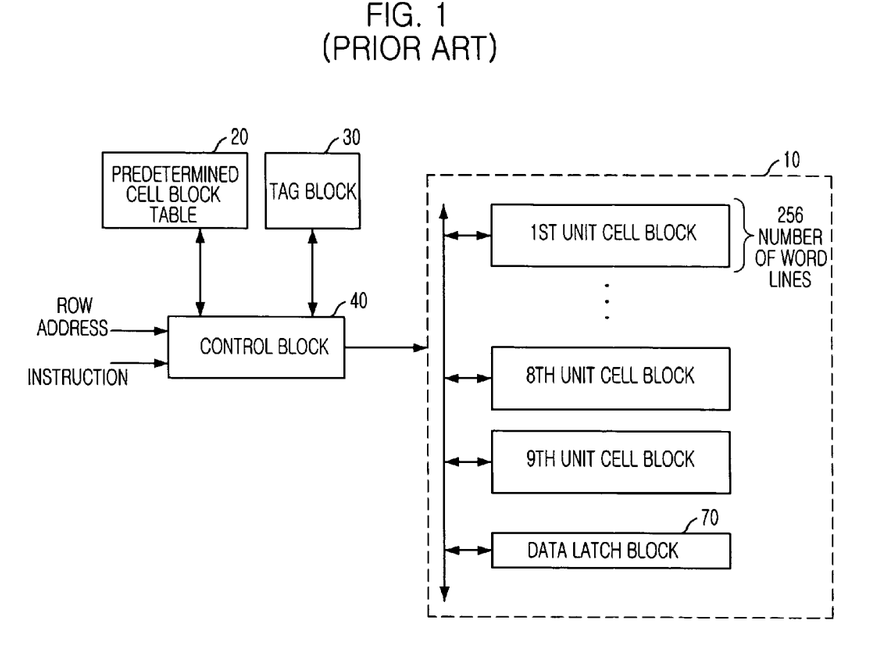
FIG. 1 is a block diagram showing a segment in a conventional semiconductor memory device.

FIG. 1 is a block diagram showing a bank in a conventional semiconductor memory device disclosed in a commonly owned copending application, U.S. Ser. No. 10/696,144, filed on Oct. 28, 2003, entitled "SEMICONDUCTOR MEMORY DEVICE WITH REDUCED DATA ACCESS TIME", which is incorporated herein by reference.

As shown, the bank includes a cell area 10, a tag block 30, a predetermined cell block table 20 and a control block 40. The cell area 100 has N+1 number of unit cell blocks and a data latch block 70. Also, in each unit cell block, e.g., 110, M number of word lines is coupled to a plurality of unit cells. The N and M are positive integers. Herein, N is 8 and M is 256.

In addition, a size of memory device, i.e., a storage capability, is calculated with the exception of the additional unit cell block. Namely, a size of the bank is M(number of word lines)×N(number of unit cell blocks)×(number of bit lines). The predetermined cell block table 20 includes a plurality of registers for storing predetermined restore cell block address information. The predetermined restore cell block address information contains at least one predetermined restore cell block address among (8+1)×256 word line addresses. The tag block 30 generates a target restore cell block address corresponding to an access cell block address based on the predetermined restore cell block address information. The control block 40 controls the predetermined cell block table 20, the cell area 100 and the tag block 30 in order to support an cell block interleaving mode which can make the memory device operate on high speed without reduction of data access time when at least two data accesses are sequentially occurred in the same bank.

Herein, the cell block interleaving mode is defined as an operation that, during a current data in response to a current instruction is restored in the original cell block or in another cell block, a next data in response to a next instruction is simultaneously outputted from the same cell block.

In addition, a row address inputted to the control block 40 of the memory device corresponds to 8×256 word lines; and the other word lines, i.e., 256 word lines of additional cell block are assigned as predetermined word lines. However, the predetermined word lines are not fixed but changed during an operation of the memory device.

Figure 2:
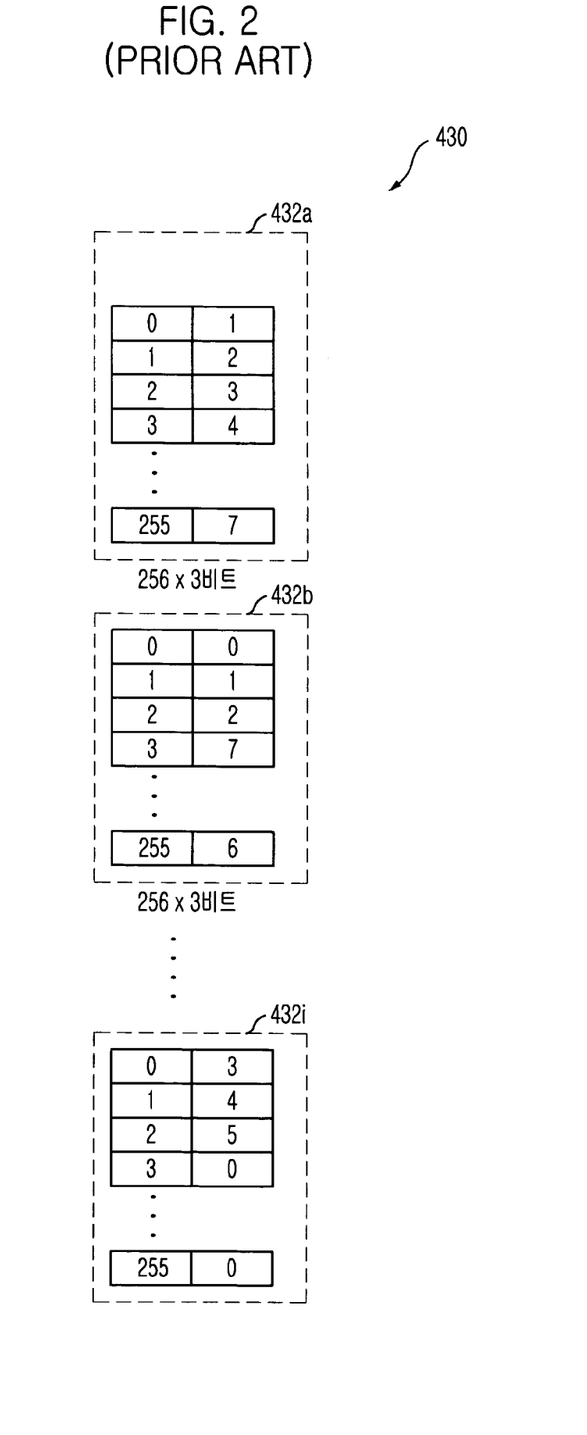
FIG. 2 is an exemplary block diagram depicting a tag block shown in FIG. 1.

FIG. 2 is a block diagram depicting the tag block 30 shown in FIG. 1.

As shown, the tag block 30 includes the 8+1 number of unit tag tables 210A to 210I in response to the first to ninth unit cell blocks 110 to 190.

Herein, each of unit tag tables 210A to 210I has 256 registers, and one register LBA consists of three bits because the number of the logical cell block addresses is 8. For instance, the first unit tag table 210A stores information what logical cell block is corresponded with each 256 numbers of the word lines included in the first unit cell block, and the second unit tag table 210B stores information what logical cell block is corresponded with each of 256 numbers of the word lines included in the second unit cell block.

In addition, in each unit tag table 210A to 210I, the first register 0 stores the logical cell block address in response to the word line 'WL0' of each unit cell block, the second register 1 stores the logical cell block address in response to the word line 'WL1' of each unit cell block, and 256th register 255 stores the logical cell block address in response to the word line 'WL255' of each unit cell block.

For example, referring to the first unit tag table 110A, first register 0 stores '1' and $255^{th}$ register 255 stores '7'. That is, in the first unit cell block, first word line WL0 corresponds with first word line WL0 of the second logical unit cell block and $255^{th}$ word line WL255 corresponds with $255^{th}$ word line WL255 of the eighth logical unit cell block.

Figure 3:
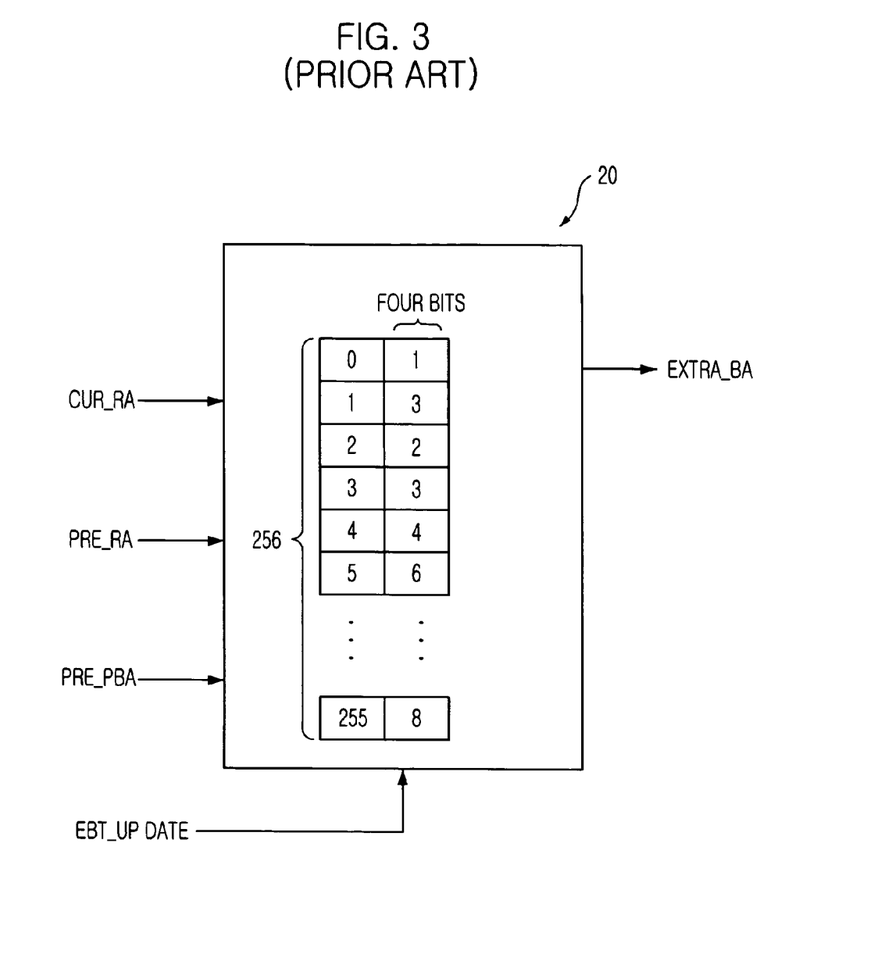
FIG. 3 is an exemplary block diagram describing a predetermined cell block table shown in FIG. 1.

FIG. 3 a block diagram describing the predetermined cell block table 20 shown in FIG. 1.

As shown, the predetermined cell block table 20 includes 256 registers, each having the predetermined restore cell block address information. The predetermined restore cell block address information contains a predetermined restore cell block address. The predetermined restore cell block address consists of 4 bits because the number of physical unit cell blocks is nine. The predetermined restore cell block address information represents a target cell block to be restored, corresponding to an accessed word line of unit cell block.

For instance, referring to the predetermined restore cell block address stored in each register, a first register 0 stores '1' and a second register 1 stores '3'. That is, a predetermined word line of a first word line WL0 is a first word line WL0 of the second unit cell block and a predetermined word line of a second word line WL1 is a second word line WL0 of the forth unit cell block. Herein, during the operation of the memory device, 256 registers of the predetermined cell block table are continuously updated.

Figure 4:
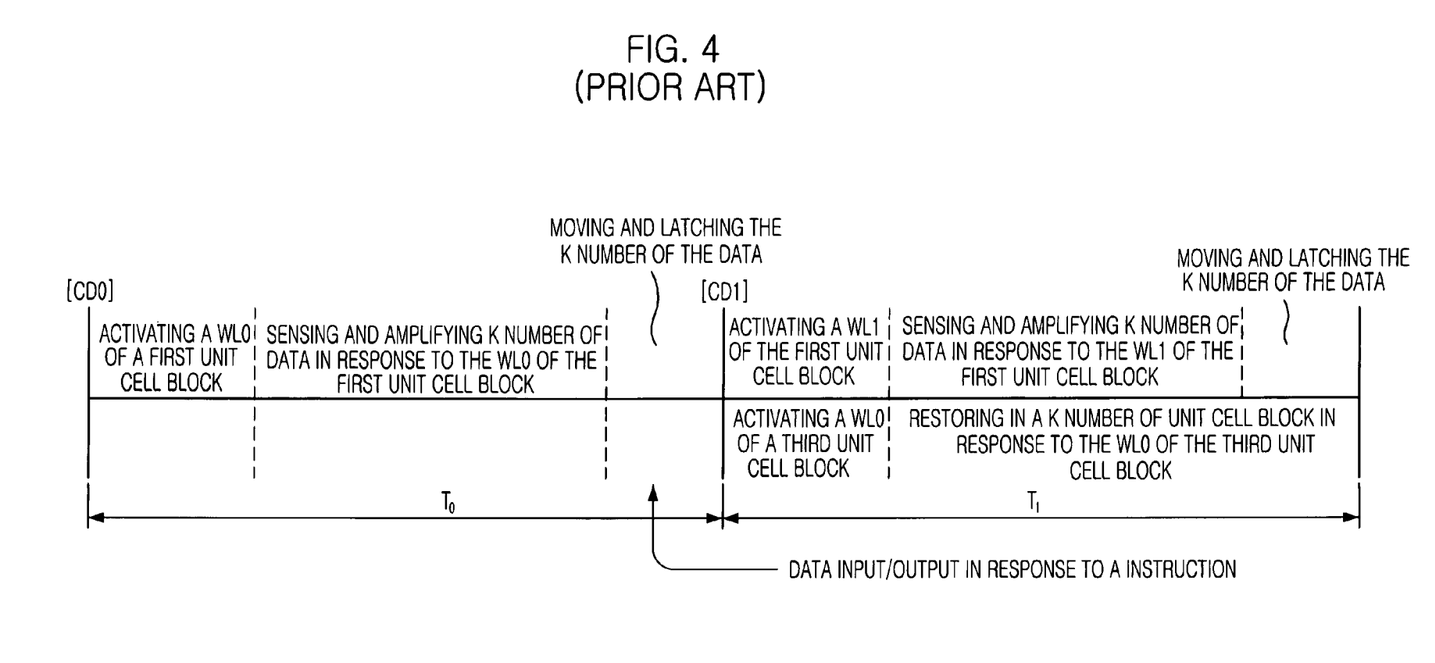
FIG. 4 is a timing diagram describing the operation of the memory device described in FIG. 1.

FIG. 4 is a timing diagram describing operation of the memory device shown in FIG. 1; and, especially, describes the intra cell block interleaving mode when a first and a second data are sequentially accessed in the same unit cell block among 8+1 numbers of the unit cell blocks shown in FIG. 1.

Hereinafter, referring to FIGS. 1 to 4, there is described the operation of the conventional memory device shown in FIG. 1.

The additional unit cell block is used for restoring the first data when the second data are sequentially accessed in the same unit cell block. As shown in FIG. 4, the first data is stored in unit cells coupled to a first word line WL0, and the second data is stored in unit cells coupled to a second word line WL1 of the same unit cell block.

First, at a first timing period $T_0$, the first word line WL0 of, e.g., first unit cell block 110, is activated in response to a first instruction CD0; and, then, first data in response to the first word line WL0 is sensed and amplified. The amplified first data moves to the data latch block 70.

If the first instruction CD0 is a read instruction, data in response to the first instruction CD0 among K number of data latched in the data latch block 70 is outputted; otherwise, i.e., if the first instruction CD0 is a write instruction, data in response to the first instruction CD0 among K number of data latched in the data latch block 70 is overwritten by an inputted data of external circuit.

At a second timing period $T_1$, first, the second word line WL1 of, e.g., first unit cell block 110, is activated in response to a second instruction CD1; and, at the same time, the first word line WL0 of, e.g., third unit cell block, is activated.

Then, the second data in response to the second word line WL1 is sensed and amplified; and, at the same time, the first data is restored into unit cells in response to the first word line WL0 of the third unit cell block.

As described above, the data access time of the conventional memory device can be actually precluded the data restoration time, because the second data can be sensed and amplified by the next instruction during the first data in response to the present instruction is restored. Thus, the data access time can be effectively reduced to thereby obtain a high speed operation of the memory device. In addition, in the conventional memory device, the data restoration operation can be simplified by simply changing only the cell block address of the data.

In the other hand, hereinafter, there is described the inter cell block interleaving mode when a third and a forth data are sequentially accessed in each different unit cell block among 8+1 numbers of the unit cell blocks (not shown).

Contrary to the intra cell block interleaving mode, the third data outputted from a unit cell block is stored in the original unit cell block at the same timing of outputting the forth data from another unit cell block.

In this case, the data access time of the conventional memory device can be actually precluded the data restoration time, because the forth data can be sensed and amplified by the next instruction during the third data in response to the present instruction is restored.

In the conventional memory device, the inputted cell block address is considered as the logical unit cell block address, i.e., address for selecting one among 8 unit cell blocks. But the conventional memory device actually includes 8+1 unit cell blocks, so the inputted cell block address is converted into a physical unit cell block address. This process is carried out by the control block 40.

As above described, for performing a data access operation on high speed in the conventional semiconductor memory device shown in FIG. 1, the tag block 430 should compare a present unit cell block, which is currently accessed in response to the present inputted address, with a preceding unit cell block, which is accessed by the prior inputted address.

Figure 5:
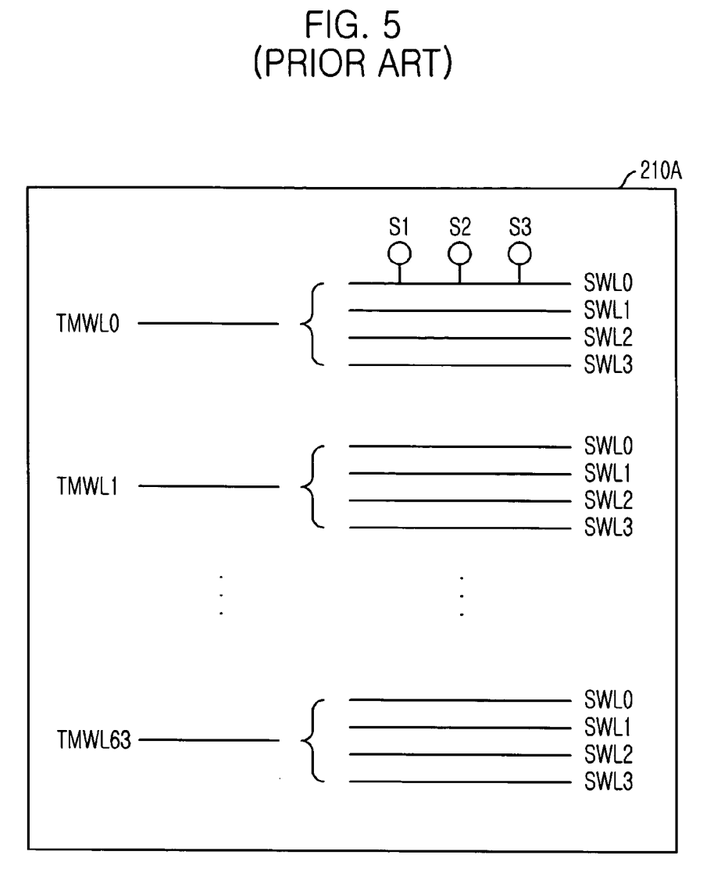
FIG. 5 is a block diagram showing a tag table shown in FIG. 2.

FIG. 5 is a block diagram showing the tag table, e.g., 210A, shown in FIG. 2.

As shown, the tag table includes 256 registers, each for storing 3-bit code. Namely, each register is constituted with first to third bits S1 to S3. Also, the tag table includes 64 main registers TMWL0 to TMWL63, each main register having 4 sub registers SWL0 to SWL3. That is, the number of total registers is 256, i.e., 64(main)×4(sub).

On the other hand, the tag block 30 should includes an additional row decoder for comparing the present unit cell block, which is currently accessed in response to the present inputted address, with the preceding unit cell block, which is accessed by the prior inputted address.

Figure 6:
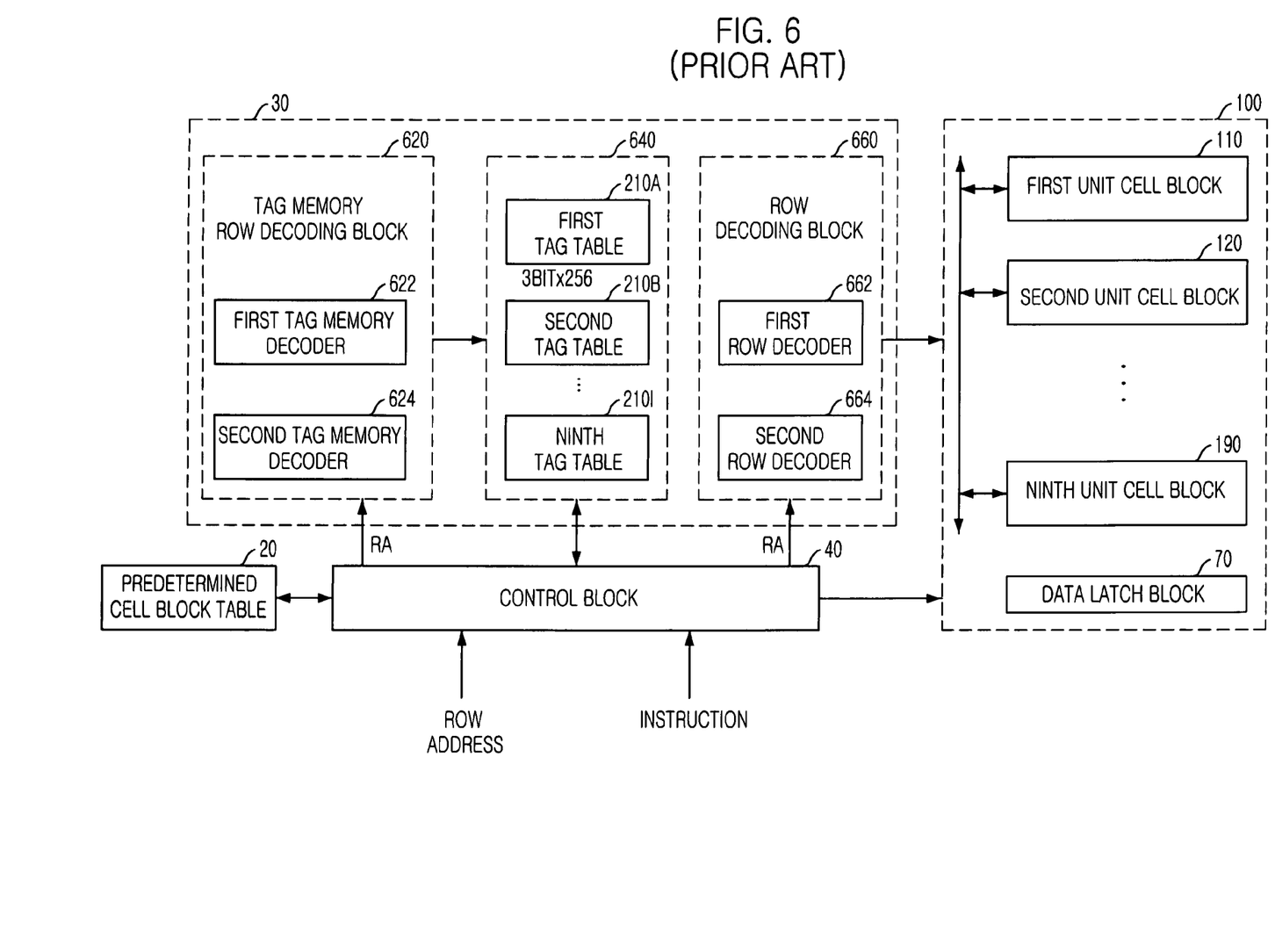
FIG. 6 is a block diagram depicting the tag block 30 shown in FIG. 1.

FIG. 6 is a block diagram depicting the tag block 30 shown in FIG. 1.

As shown, the tag block 30 includes a tag memory row decoding block 620, a row decoding block 660 and a tag memory block 640. Herein, the tag memory block 640 has the first to ninth tag tables 210A to 210I shown in FIG. 2.

The tag memory row decoding block 620 is for decoding an inputted row address RA in order to access one of the first to ninth tag tables 210A to 210I. The row decoding block 660 is for decoding the inputted row address RA in order to access one of the first to ninth cell blocks 110 to 190 in the cell area 100.

In detail, the tag memory row decoding block 620 includes a first tag memory decoder 622 and a second tag memory decoder 624. Herein, the first tag memory decoder 622 decodes the inputted row address RA in order to select one of the 64 main registers TMWL0 to TMWL63; and the second tag memory decoder 624 decodes the inputted row address RA in order to select one of the 4 sub registers SWL0 to SWL3 included in a main register selected by the first memory decoder 622.

Likewise, the row decoding block 660 includes a first row decoder 622 and a second row decoder 664 for activating a word line of the selected unit cell block in the cell area 100 in response to the inputted row address.

Figure 7:
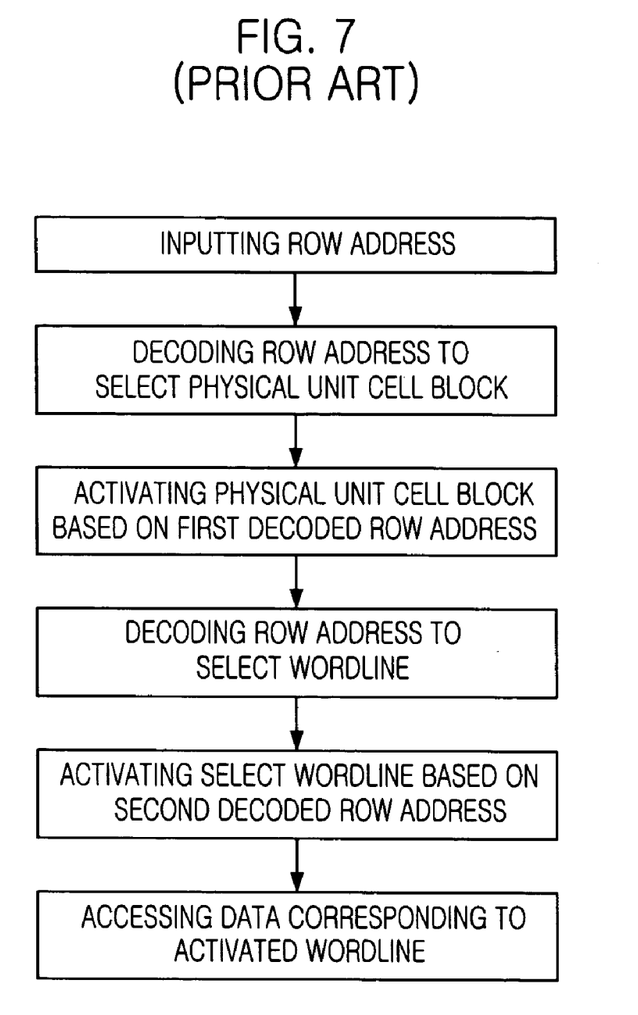
FIG. 7 is a flowchart describing a decoding operation of the semiconductor memory device shown in FIG. 6.

FIG. 7 is a flowchart describing a decoding operation of the semiconductor memory device shown in FIG. 6.

As shown, first of all, a row address is inputted to the control block 40 in the semiconductor memory device. Then, the control block 40 first decodes the row address to thereby output the first decoded row address to the tag block 30.

Thereafter, using the tag memory row decoding block 620 and the tag memory block 640, the tag block 30 searches a physical unit cell block corresponding to the present inputted row address based on the first decoded row address. Then, the row decoding block 660 of the tag block 30 activates the physical unit cell block of the first to ninth unit cell block 110 to 190 included in the cell area 100.

On the other hand, the row decoding block 470 of the tag memory 30 decodes the first coded row address outputted from the control block 40 in order to activate a word line of the selected unit cell block in the cell area 100 in response to the inputted row address.

Then, data in response to the activated word line of the selected unit cell block by the tag block 30 is accessed.

As above described, though the semiconductor memory device having the tag block can perform a data access operation on high speed because the data stored in each unit cell block is continuously accessed, the tag block having a row address decoding block for controlling the data access operation is much complicated; and a size of the tag block is dramatically increased.

SUMMARY OF INVENTION

It is, therefore, an object of the present invention to provide a semiconductor memory device, for accessing data on high speed, having a tag block which is constituted with single row decoder so that a circuit size of the semiconductor memory device is reduced and a control of a data access operation is more simplified.

In accordance with an aspect of the present invention, there is provided a semiconductor memory device including a row decoding block for decoding an inputted address to thereby generate a logical unit cell block address and a decoded word line address; a tag block for converting the logical unit cell block address into a physical unit cell block address; a decoded address latching block for latching the decoded word line address to thereby output the decoded word line address as a word line activation signal in response to the physical unit cell block; and a cell area for outputting a data, which is stored therein, in response to the word line activation signal.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device having an advanced tag block according to the present invention will be described in detail referring to the accompanying drawings.

Figure 8:
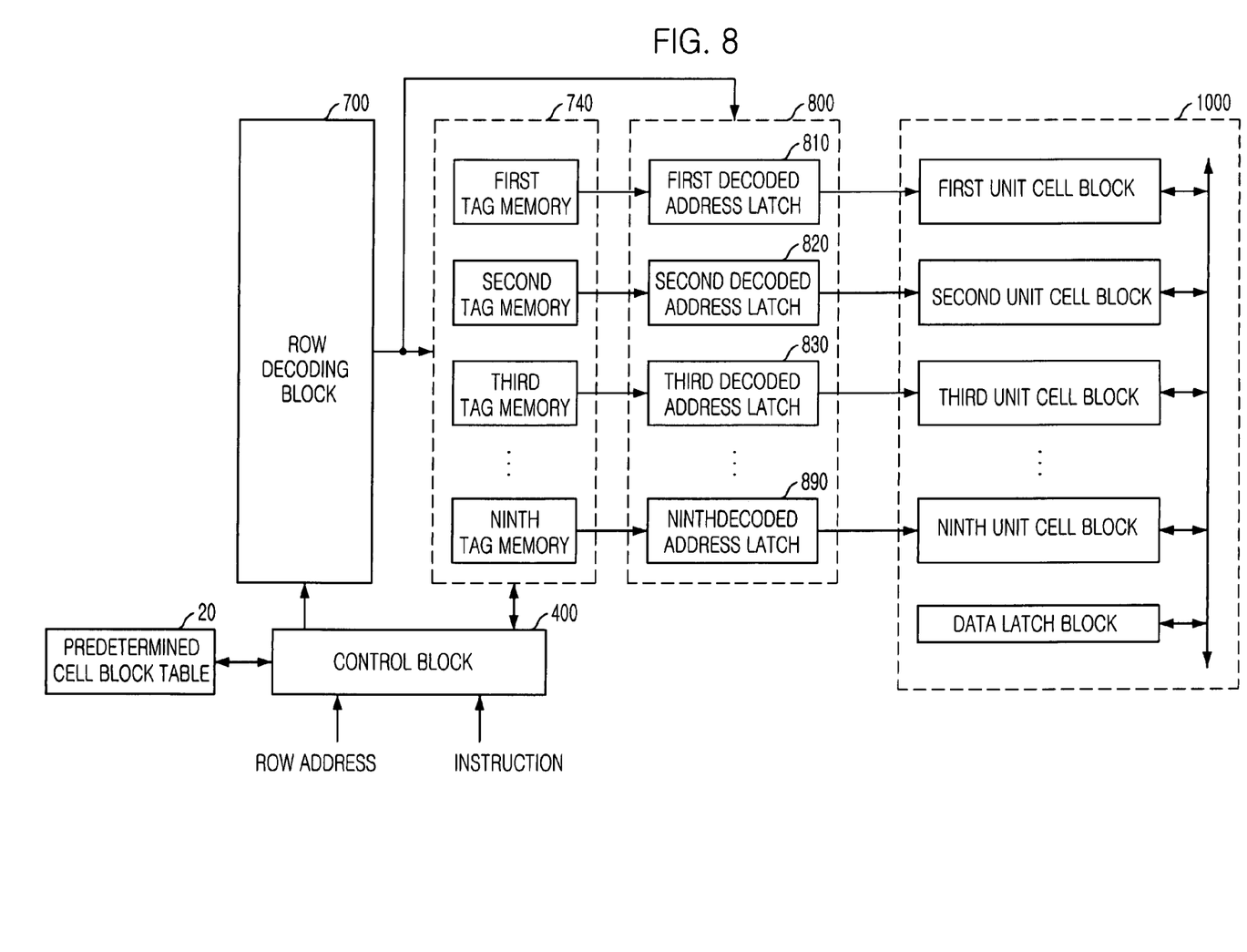
FIG. 8 is a block diagram showing a semiconductor memory device in accordance with the present invention.

FIG. 8 is a block diagram showing a semiconductor memory device in accordance with the present invention.

As shown, the semiconductor memory device includes a control block 400, a predetermined cell block table 20, a row decoding block 700, a tag memory block 740, a decoded address latching block 800 and a cell area 1000.

The cell area 1000 has N+1 number of unit cell blocks, e.g., first to ninth unit cell blocks, each including 256 number of word lines for responding to an inputted row address. A row address is inputted in response to eight unit cell blocks. Herein, the cell area 1000 further includes additional unit cell block. The predetermined cell block table 20 is used for storing information wherein at least more than one word line among the (8+1)×256 number of the word lines is assigned as a predetermined restorable word line by using the information. The row decoding block 700 is for decoding the row address in order to select one of the first to ninth unit cell blocks. The tag block 740 receives the row address, senses a logical cell block address designated for accessing one of N number of unit cell blocks, converts the logical cell block address into a physical cell block address designated for accessing one of the N+1 number of unit cell blocks and outputs the physical cell block address. The control unit 400 is used for controlling the tag block 740, the row decoding block 700 and the predetermined cell block table 20 for activating one word line of a unit cell block selected by the physical cell block address. Herein, N is 8.

The tag block 740 includes an 8+1 number of tag memory, i.e., first to ninth tag memories, for storing information that 256 number of word lines included in each of 8+1 number of unit cell blocks correspond to the logical unit cell block. Herein, each tag memory is the same to each tag table shown in FIG. 2 in their structure.

The decoded address latching block 800 includes first to ninth decoded address latches 810 to 890, each corresponding to each of the first to ninth tag memories.

Figure 9:
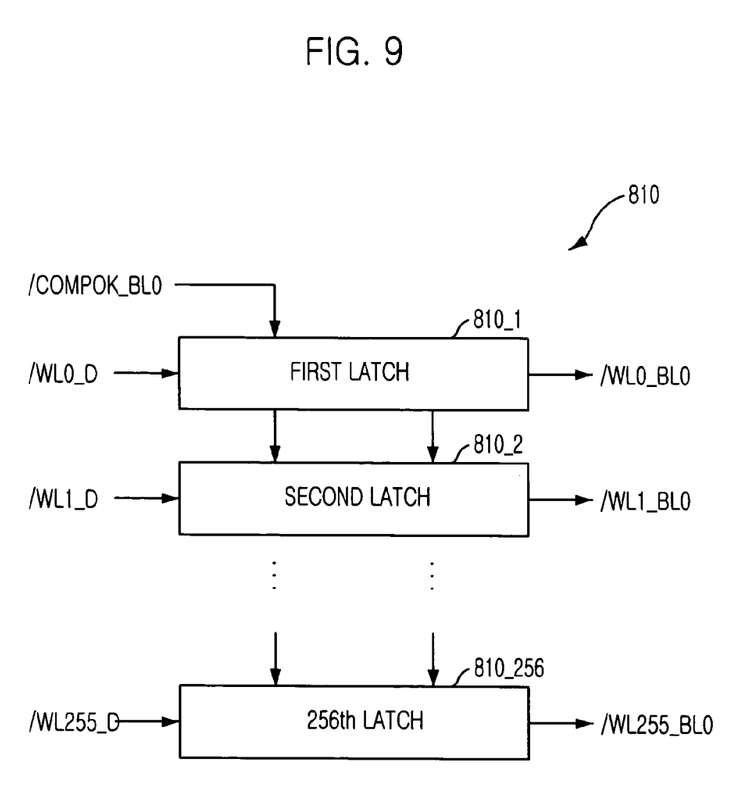
FIG. 9 is a block diagram describing the decoded address latch shown in FIG. 8.

FIG. 9 is a block diagram describing the decoded address latch, e.g., the first decoded address latch 810, shown in FIG. 8.

As shown, the first decoded address latch 810 includes a plurality of latch blocks. The number of latch blocks is 256. Namely, the first decoded address latch 810 has first to $256^{th}$ latch blocks 810_1 to 810_256, each corresponding to 256 word lines in each of the first to ninth unit cell block and being activated in response to the physical cell block address. Each latch block, e.g., 810_1, is for receiving a decoded row address signal outputted from the row decoding block 700 and activating a word line in response to the decoded row address signal, e.g., /WL0_D.

Figure 10:
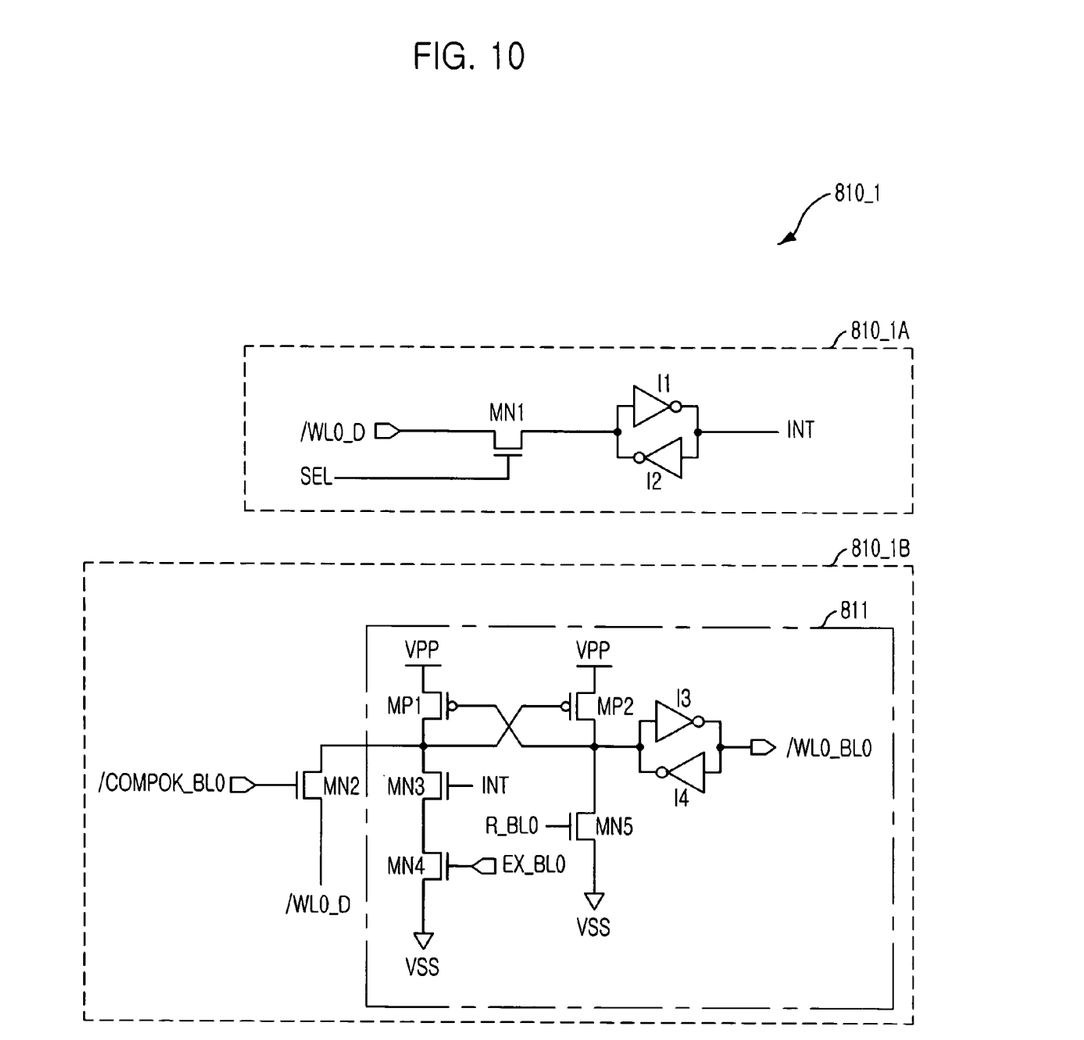
FIG. 10 is a schematic circuit diagram describing the latch block shown in FIG. 9.

FIG. 10 is a schematic circuit diagram describing a latch block, e.g., the first latch block 810_1, shown in FIG. 9.

As shown, the latch block, e.g., 810_1, includes a normal word line latch 810_1B and a predetermined word line latch 810_1A. The normal word line latch 810_1B receives the decoded row address signal /WL0_D and generates a word line activation signal /WL0_BL0 in response to an internal control signal INT and the physical cell block address outputted from the tag block 740. Also, the predetermined word line latch 810_1A receives the decoded row address signal /WL0_D to thereby output as the internal control signal INT in response to a word line selection signal SEL.

In detail, the predetermined word line latch 810_1A includes a first NMOS transistor MN1, which is controlled by the word line selection signal SEL, and first and second inverter I1 and I2, which are circularly connected to each other for latching an output signal of the first NMOS transistor MN1.

Also, the normal word line latch 810_1B includes a second NMOS transistor MN2 and a signal transmission block 811. The second NMOS transistor MN2 has a gate, a drain and a source, wherein the gate is for receiving a cell block activation signal /COMPOK_BL0 and a drain/source is coupled to the decoded row address signal /WL0_D.

Furthermore, the signal transmission block 811 includes first and second PMOS transistors MP1 and MP2, third to fifth NMOS transistor MN3 to MN5 and third and fourth inverters 13 and 14. Each of the first and second PMOS transistors MP1 and MP2 has a gate, a drain and a source, wherein the source is coupled to a supply voltage VPP. The gate of the first PMOS transistor MP1 is coupled to the drain of the second PMOS transistor MP2; and the gate of the second PMOS transistor MP2 is coupled to the drain of the first PMOS transistor MP1. The third NMOS transistor MN3 has a gate for receiving the internal control signal INT and a drain coupled to the drain of the first PMOS transistor MP1. The fourth NMOS transistor MN4 has a gate for receiving a predetermined word line activating signal EX_BL0 and a source coupled to a ground VSS. Also, the fifth NMOS transistor MN5 has a gate for receiving a reset signal R_BL0 and a source coupled to the ground VSS. The third to fourth inverters 13 and 14 circularly connected to each other are for keeping a logic state of the word line activation signal /WL0_BL0.

Figure 11:
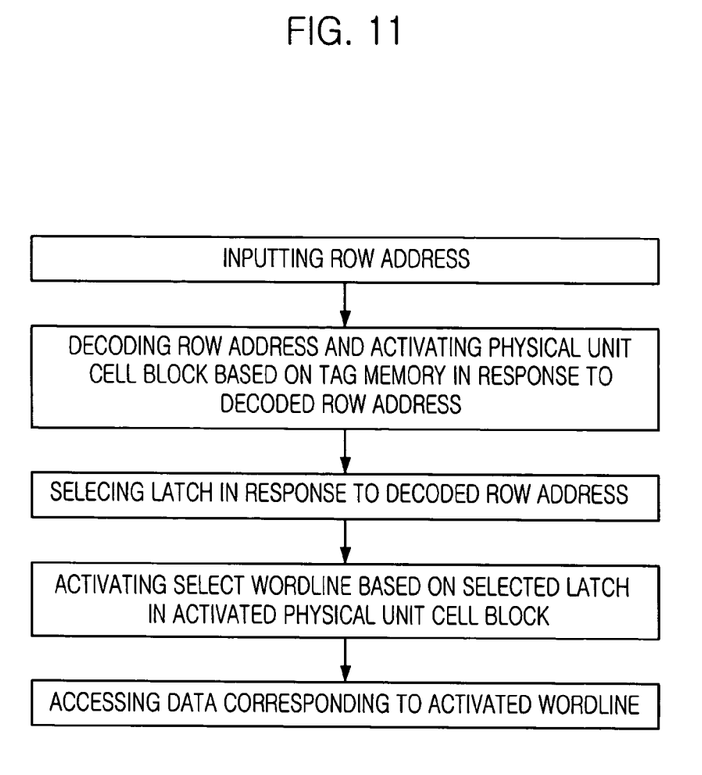
FIG. 11 is a flowchart describing a decoding operation of the semiconductor memory device shown in FIG. 8.

FIG. 11 is a flowchart describing a decoding operation of the semiconductor memory device shown in FIG. 8. Hereinafter, referring to FIGS. 8 to 11, operation of the semiconductor memory device is described in detail.

As above described, the semiconductor memory device in accordance with the present invention includes an additional unit cell block, e.g., the ninth unit cell block, except for unit cell blocks, e.g., the first to eighth unit cell blocks, each corresponding to the inputted logical cell block address. The tag block 740 is for converting the inputted logical cell block address into the physical cell block address and activating a unit cell block in response to the physical cell block address. Then, in the activated unit cell block, the data access operation is performed in response to an active command.

Continuously, the operation of the semiconductor memory device is described in more detail.

If a command is inputted for a data access operation, the row decoding block 700 decodes an inputted row address. Herein, after decoding the inputted row address, the row decoding block 700 outputs a logical cell block address and a decoded row address signal to the tag block 740 and the decoded address latching block 800.

Then, the tag block 740 converts the logical cell block address into a physical cell block address based on the logical cell block address and the decoded row address signal to thereby output the physical cell block address to the decoded address latching block 800.

On the other hand, the decoded address latching block 800 includes the first to ninth decoded address latching blocks 810 to 890, each for latching the decoded row address signal outputted from the row decoding block 700. In addition, each of the first to ninth decoded address latching blocks 810 to 890 has the first to 256$^{th}$ latch blocks, i.e., 256 addresses, in response to 256 word lines in each of the first to ninth unit cell blocks.

The physical cell block address outputted from the tag block 740 activates one of the first to ninth decoded address latches 810 to 890 in the decoded address latching block 800. Then, the decoded row address signal latched in the activated decoded address latch is inversed and outputted as the word line activation signal to the cell block 1000. Thus, one of 256 word lines in a unit cell block corresponding to the activated decoded address latch is activated.

As above described, in the semiconductor memory device in accordance with the present invention, one row decoding block 700 decodes the inputted row address to thereby generates the logical cell block address and the decoded row address signal. Then, the logical cell block address is converted into the physical cell block address by the tag block 740; and the decoded row address signal is latched in each of the first to ninth decoded address latches 810 to 890 in the decoded address latching block 800.

Therefore, in compared with the conventional semiconductor memory device having two decoding blocks for activating a word line in response to an inputted row address, the semiconductor memory device having one row decoding block and one decoded address latching block in accordance with the present invention can be embodied without decreasing an operation speed of the semiconductor memory device.

Referring to FIG. 11, the physical cell block address activates one of the first to ninth decoded address latches 810 to 890; and, then, the word line activation signal outputted from one activated decoded address latch activates a word line in a unit cell block corresponding to the activated decode address latch. Namely, each of the first to ninth decoded address latches 810 to 890 is corresponded to each of the first to ninth unit cell blocks in the cell area 1000.

In addition, each of the first to 256$^{th}$ latch blocks in each of the first to ninth decoded address latches is matched with each of 256 word lines in each of the first to ninth unit cell blocks in the cell area 1000. Thus, each of the first to 256$^{th}$ latch blocks can be used as a word line driver for controlling each of 256 word lines.

As above described, each decoded address latch includes 256 latch blocks, i.e., the first to 256$^{th}$ latch blocks. In addition, each decoded address latch can has a similar structure of the tag table shown in FIG. 5. That is, each decode address latch can include 64 main latches, each main register having 4 sub latches. In this case, the number of total registers is 256, i.e., 64(main)×4(sub). Namely, each decoded address latch has a structure depending on outputs of the row decoding block 700.

Referring to FIG. 10, an operation of each latch block is described in detail.

The cell block activation signal /COMPOK_BL0 is activated based on the physical cell block address. Namely, if the cell block activation signal /COMPOK_BL0 is activated, it is determined which one of the first to ninth unit cell blocks will be activated.

If the second NMOS transistor MN2 is turned on in response to the cell block activation signal /COMPOK_BL0, the decoded row address signal /WL0_D is latched by the first and second PMOS transistors MP1 and MP2. Herein, the decoded row address signal /WL0_D is activated as a logic low state. Thus, if the second NMOS transistor MN2 is turned on, a logic low state signal is inputted to the third inverters I3. Then, the third inverter I3 outputs an inverse state of inputted signal. That is, the word line selection signal /WL0_BL0 is activated as a logic high state.

On the other hand, if the word line selection signal SEL is inputted when the decoded row address signal /WL0_D is inputted, the first NMOS transistor MN1 included in the predetermined word line latch 810_1A is turned on; and, then, the internal control signal INT is activated as a logic high state.

If the internal control signal INT is activated as a logic high state, the third NMOS transistor MN3 is turned on. At this time, if the data access operation is performed in the same unit cell block which is accessed at the prior operation, the predetermined word line activating signal EX_BL0 is activated as a logic high state; and, then, the fourth NMOS transistor MN4 is turned on. In this case, though the cell block activation signal /COMPOK_BL0 is not activated, a logic low state signal is latched in the first and second PMOS transistors MP1 and MP2 and the word line activation signal /WL0_BL0 is activated as a logic high state by the third inverter I3.

Herein, the word line selection signal SEL and the predetermined word line activating signal EX_BL0 are used when the data access operation is continuously performed in one unit cell block of the semiconductor memory device according to the present invention. In detail, the word line selection signal SEL is for latching an inputted address every data access operation. The predetermined word line activating signal EX_BL0 is for selecting a unit cell block, which has a predetermined word line for restoring preceding accessed data, when the data access operation is continuously performed in one unit cell block.

When the data access operation is continuously performed in one unit cell block, the preceding accessed data is restored in other unit cell block, i.e., not original unit cell block. Thus, because it can be always occurred that the data access operation is continuously performed in one unit cell block, the word line selection signal SEL is always activated for latching an inputted address every data access operation; and, then, the preceding accessed data is restored in a predetermined word line of the corresponding unit cell block when the predetermined word line activating signal EX_BL0 is inputted.

That is, for performing the data access operation, the cell block activation signal /COMPOK_BL0 is activated and, then, the decoded row address signal /WL0_D is inputted and inverted to thereby output as the word line activation signal /WL0_BL0.

In addition, for restoring a preceding accessed data when the data access operation is continuously performed in the same unit cell block, the word line selection signal SEL, the internal control signal INT and the predetermined word line activating signal EX_BL0 are activated and, then, the word line activation signal /WL0_BL0 is outputted as a logic low state. When the data access operation is continuously performed in the same unit cell block, a data restoration is performed in a unit cell block having a word line corresponding to a predetermined word line. Herein, the predetermined word line activating signal Ex_BL0 is for selecting the unit cell block having a word line corresponding to a predetermined word line.

Figure 12:
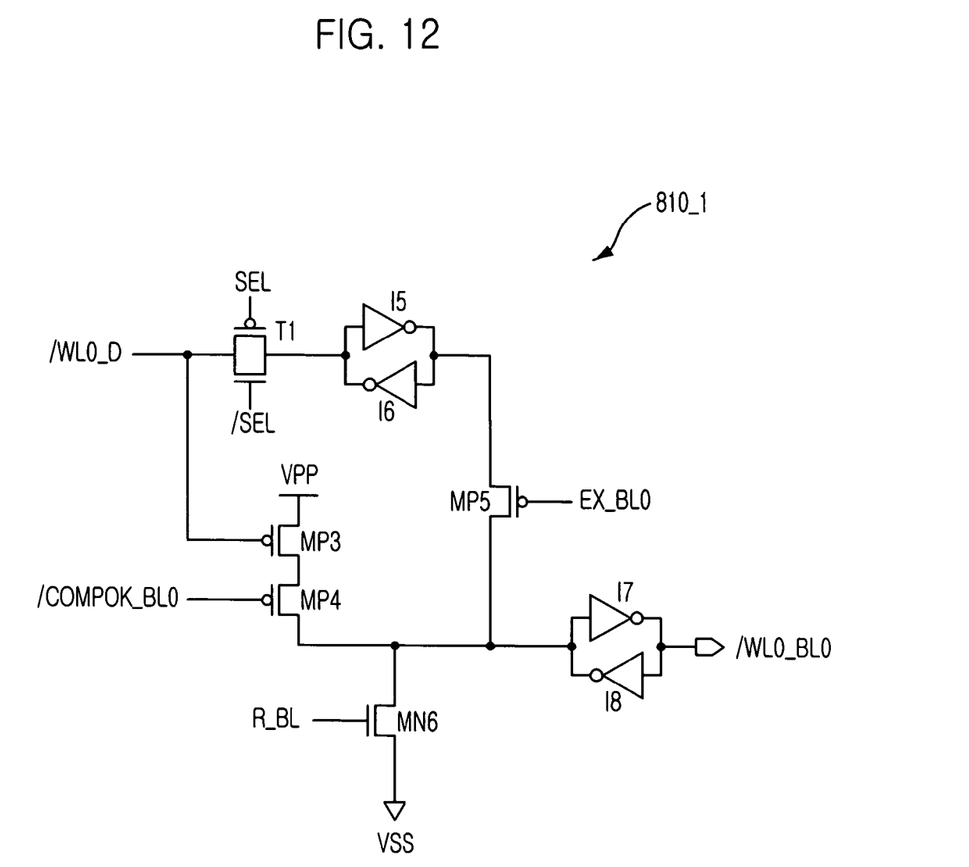
FIG. 12 is a schematic diagram describing a latch block in accordance with an alternate embodiment of the invention.

FIG. 12 is a schematic circuit diagram describing a latch block, e.g., the first latch block 810_1, shown in FIG. 9 in accordance with another embodiment of the present invention.

As shown, the latch block, e.g., 810_1, includes a first transfer gate T1, fifth to eighth inverters 15 to 18, third to fifth PMOS transistors MP3 to MP5 and a sixth NMOS transistor MN6.

The first transfer gate T1 transmits the decoded row address signal /WL0_D in response to the word line selection signal SEL. The fifth inverter 15 is for inverting the decoded row address signal /WL0_D. The sixth inverter 16 circularly connected to the fifth inverter 15 is for latching the decoded row address signal /WL0_D. The fifth PMOS transistor MP5 has a gate for receiving the predetermined word line activating signal EX_BL0 and a source/drain for receiving an output signal from the fifth inverter 15.

In addition, the third PMOS transistor MP3 has a gate for receiving the decoded row address signal /WL0_D and a source coupled to a supply voltage VPP; and the fourth PMOS transistor MP4 has a gate for receiving the cell block activation signal /COMPOK_BL0 and a source coupled to a drain of the third PMOS transistor MP3. The sixth NMOS transistor MN6 has a gate for receiving the reset signal R_BL and a source coupled to a ground.

The seventh inverter 17 coupled to a source/drain of the fifth PMOS transistor MP5, a drain of the sixth NMOS transistor MN6 and a drain of the fourth PMOS transistor MP4 is for generating the word line activation signal /WL0_BL0. The eighth inverter 18 circularly connected to the seventh inverter 17 is for latching the word line activation signal /WL0_BL0.

An operation of the latch block 810_1 shown in FIG. 12 is very similar to the operation of the latch block shown in FIG. 10. However, referring to FIG. 12, the internal control signal INT is not necessary.

Therefore, in the semiconductor memory device, for accessing data on high speed, having a tag block which is constituted with single row decoder, a size of the semiconductor memory device is reduced and a control of a data access operation is more simplified.

The present application contains subject matter related to Korean patent application No. 2003-98502, filed in the Korean Patent Office on Dec. 29, 2003, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A semiconductor memory device, comprising:
a single row decoding block configured to decode an inputted address to thereby generate a logical unit cell block address and a decoded word line address;
a tag block for converting the logical unit cell block address configured to access N unit cell blocks into a physical unit cell block address for accessing N+1 unit cell blocks, wherein N is an integer greater than 0;
an address latching block configured to latch the decoded word line address generated from the single row decoding block to thereby output a latched word line address as a word line activation signal without additional decoding in response to the physical unit cell block address;
a cell area configured to output a data, which is stored therein, in response to the word line activation signal, the cell area having N+1 unit cell blocks, each including M word lines, M being an integer greater than 0, wherein the N unit cell blocks are corresponded to the logical unit cell block address and one unit cell block accesses data with high speed;
a predetermined cell block table configured to assign M word lines among the (N+1)×M word lines as predetermined restorable word lines; and
a control unit configured to control the tag block, the single row decoding block and the predetermined cell block table to activate one word line of the unit cell block selected by the physical unit cell block address and a corresponding one of the predetermined restorable word lines,
wherein each unit address latch block in the address latching block corresponds to each latched word line,
wherein the address latching block includes latch blocks having a predetermined word line latch configured to receive the decoded word line address to thereby output as an internal control signal in response to a word line selection signal and to generate the word line activation signal in response to the internal control signal and the physical cell block address outputted from the tag block, and
wherein the predetermined word line latch includes:
a second NMOS transistor having a gate, a drain and a source, wherein the gate receives a cell block activation signal and the drain/source is coupled to the decoded word line address;
first and second PMOS transistors, each having a gate, a drain and a source, wherein the source is coupled to a supply voltage VPP, the gate of the first PMOS transistor is coupled to the drain of the second PMOS transistor and the gate of the second PMOS transistor is coupled to the drain of the first PMOS transistor;
a third NMOS transistor having a gate, a drain and a source, wherein the gate receives the internal control signal INT and the drain coupled to the drain of the first PMOS transistor;
a fourth NMOS transistor having a gate, a drain and a source, wherein the gate receives a predetermined word line activating signal and the source is coupled to a ground;

a fifth NMOS transistor having a gate, a drain and a source, wherein the gate receives a reset signal and the source is coupled to the ground VSS;

third to fourth inverters circularly connected to each other for outputting an inverse signal of the decoded word line address as the word line activation signal and keeping a logic state of the word line activation signal.

2. The semiconductor memory device as recited in claim 1, wherein the logical unit cell block address inputted to the tag block is corresponded to N unit cell blocks; and the physical unit cell block address outputted from the tag block is corresponded to N+1 unit cell blocks.

3. The semiconductor memory device as recited in claim 2, wherein the address latching block includes N+1 decoded address latches.

4. The semiconductor memory device as recited in claim 3, wherein the decoded address latch corresponding to each of M word lines has M latch blocks.

5. The semiconductor memory device as recited in claim 4, wherein the latch blocks further includes:
a normal word line latch configured to receive the decoded word line address and generating the word line activation signal in response to an internal control signal.

6. The semiconductor memory device as recited in claim 4, wherein the latch blocks includes:
a first transfer gate for transmitting the decoded word line address in response to a word line selection signal;
a fifth inverter for inverting the decoded word line address;
a sixth inverter circularly connected to the fifth inverter for latching the decoded word line address;
a fifth PMOS transistor having a gate, a source and a drain, wherein the gate receives a predetermined word line activating signal and the source/drain is for receiving an output signal from the fifth inverter;
a third PMOS transistor having a gate, a source and a drain, wherein the gate receives the decoded word line address and the source is coupled to a supply voltage;
a fourth PMOS transistor MP4 having a gate, a source and a drain, wherein the gate receives the cell block activation signal and the source is coupled to a drain of the third PMOS transistor;
a fifth PMOS transistor having a gate, a source and a drain, wherein the gate receives the predetermined word line activating signal and the source/drain is for receiving the output signal from the fifth inverter;
a sixth NMOS transistor having a gate, a source and a drain, wherein the gate receives a reset signal and the source is coupled to a ground;
a seventh inverter coupled to the source/drain of the fifth PMOS transistor, the drain of the sixth NMOS transistor and the drain of the fourth PMOS transistor for generating the word line activation signal; and
an eighth inverter circularly connected to the seventh inverter for latching the word line activation signal.

7. The semiconductor memory device as recited in claim 3, wherein the decoded address latch corresponding to each of M word lines has P main latch blocks, each having Q sub latch blocks, wherein P and Q are integers greater than 0 and M=P×Q.

8. A semiconductor memory device, comprising:
a single row decoding block configured to decode an input address and to generate a logical unit cell block address and a decoded word line address;
a tag block configured to convert the logical unit cell block address for accessing unit cell blocks into a physical unit cell block address; and
an address latching block configured to latch the decoded word line address generated from the single row decoding block and to output the latched word line address as a word line activation signal without additional decoding in response to the physical unit cell block address; and
a unit cell block configured to output data in response to the word line activation signal,
wherein each unit address latch block in the address latching block corresponds to each latched word line,
wherein the address latching block includes latch blocks having a predetermined word line latch configured to receive the decoded word line address to thereby output as an internal control signal in response to a word line selection signal and to generate the word line activation signal in response to the internal control signal and the physical cell block address outputted from the tag block,
wherein the predetermined word line latch includes:
a second NMOS transistor having a gate, a drain and a source, wherein the gate receives a cell block activation signal and the drain/source is coupled to the decoded word line address;
first and second PMOS transistors, each having a gate, a drain and a source, wherein the source is coupled to a supply voltage VPP, the gate of the first PMOS transistor is coupled to the drain of the second PMOS transistor and the gate of the second PMOS transistor is coupled to the drain of the first PMOS transistor;
a third NMOS transistor having a gate, a drain and a source, wherein the gate receives the internal control signal INT and the drain coupled to the drain of the first PMOS transistor;
a fourth NMOS transistor having a gate, a drain and a source, wherein the gate receives a predetermined word line activating signal and the source is coupled to a ground;
a fifth NMOS transistor having a gate, a drain and a source, wherein the gate receives a reset signal and the source is coupled to the ground VSS;
third to fourth inverters circularly connected to each other for outputting an inverse signal of the decoded word line address as the word line activation signal and keeping a logic state of the word line activation signal.

9. The semiconductor memory device as recited in claim 5, wherein the normal word line latch includes:
a first NMOS transistor for transmitting the decoded word line address in response to a word line selection signal;
a first inverter for receiving the decoded word line address and outputting an inverse signal of the decoded word line address as the internal control signal; and
a second inverter, which are circularly connected to the first inverter, for latching an output signal of the first NMOS transistor.

* * * * *